US011094352B2

(12) United States Patent
Wu et al.

(10) Patent No.: US 11,094,352 B2
(45) Date of Patent: Aug. 17, 2021

(54) REMOVING MECHANISM OF STORAGE DEVICE

(71) Applicant: CS SOLUTION HOLDING LIMITED, Tortola (VG)

(72) Inventors: You-Lun Wu, Taipei (TW); Kenneth Donald Wing, Santa Cruz, CA (US)

(73) Assignee: CS Solution Holding Limited, Tortola (VG)

( * ) Notice: Subject to any disclaimer, the term of this patent is extended or adjusted under 35 U.S.C. 154(b) by 61 days.

(21) Appl. No.: 16/668,568

(22) Filed: Oct. 30, 2019

(65) Prior Publication Data

US 2021/0134330 A1    May 6, 2021

(51) Int. Cl.
    *G11B 33/12*    (2006.01)
    *H05K 7/14*     (2006.01)
    *G11B 17/04*    (2006.01)
    *G11B 33/04*    (2006.01)

(52) U.S. Cl.
    CPC ........ *G11B 33/124* (2013.01); *G11B 17/0407* (2013.01); *G11B 33/04* (2013.01); *H05K 7/1415* (2013.01); *H05K 7/1488* (2013.01)

(58) Field of Classification Search
    None
    See application file for complete search history.

(56) References Cited

U.S. PATENT DOCUMENTS

| | | | |
|---|---|---|---|
| 6,515,855 B1 * | 2/2003 | Removedummy ..... | G06F 1/184 361/609 |
| 7,808,777 B2 * | 10/2010 | Luo ...................... | G11B 33/127 361/679.37 |
| 2008/0112126 A1 * | 5/2008 | Hsu ...................... | G11B 33/124 361/679.38 |

FOREIGN PATENT DOCUMENTS

WO    WO-2013131028 A1 *  9/2013    ............. G11B 33/00

\* cited by examiner

*Primary Examiner* — William J Klimowicz
(74) *Attorney, Agent, or Firm* — Rosenberg, Klein & Lee

(57) ABSTRACT

A removable mechanism for a hard drive is revealed. The removable mechanism includes an upper substrate and a base plate hanged and sliding below the upper substrate, and a control handle and a sliding board are set between the upper substrate and the base plate to carry each other. The control handle controls a pivot element sliding on an opening of the base plate. By carrying each other to carry a stop element of the base plate, the stop element slides on a concave opening for dismounting a storage device inserted to the removable drawing mechanism. Thereby, the present application is convenient for dismounting the storage device.

9 Claims, 9 Drawing Sheets

REMOVING MECHANISM OF STORAGE DEVICE

FIELD OF THE INVENTION

The present application relates generally to a removing device, and particularly to a removing mechanism of storage device.

BACKGROUND OF THE INVENTION

Generally, a cloud system usually provides cloud storage space for storing data or files of customers according to their subscription, in particular for applications of distributed computing systems. For example, clouding computing becomes more popular in consumer and enterprise data storage. The so-called cloud data storage adopts massive network storage servers. By serially connecting a plurality of hard disk drives or a plurality of solid-state drives, a unified repository, central processing units, banks, or arrays are organized and deployed. Typically, the plurality of servers are disposed for the purpose of large-scale operations. For example, a single cloud data storage system can include thousands or tens of thousands of storage servers installed in stacks or in rack-mounted arrays. Thereby, the reduction of the space occupied by a single server can obviously reduce the overall size and operating cost of a cloud data storage system.

Currently, there is a handle on the panel of a hard-disk removable box. The handle is rotatably connected to the panel and further includes a buckle and a pushing part. The buckle can hook the pillars of the panel. Thereby, when the handle is bent and retrieved, it can be fixed to the pillars instead of shaking. To replace the hard disk in the removable box, the hand on the panel of the hard-disk removable box is rotated. Then the pushing part will push the rack or cabinet so that the removable box and the hard disk can be removed from the rack or cabinet for replacement. Unfortunately, to rotate the handle as described above, certain operating space is required, resulting in the concern of extending of the size of rack or cabinet and inconvenience of dismounting hard drives. In addition, to replace a hard drive, the whole removable box has to be dismounted, meaning that a plurality of removable boxes have to be dismounted for a plurality of hard drives. Besides, for the volume of the cabinet, the size of the removable boxes should be considered.

According to the above problems, the present application provides a removing mechanism of storage device. A control handle and a sliding plate slide and move with linkage arrangement between a top plate and a bottom plate for driving a block member of the bottom plate extended from a sliding recess of the top plate. Then the storage device on the top plate can be dismounted rapidly and thus providing convenience in dismounting storage devices.

SUMMARY

An objective of the present application is to provide a removing mechanism of storage device. A top plate and a bottom plate sandwich a control handle and a sliding plate and the control handle controls the sliding plate to slide between the top plate and the bottom plate for driving a block member of the bottom plate extended from a sliding recess of the top plate. Then the storage device on the top plate can be dismounted rapidly and thus providing convenience in dismounting storage devices.

The present application discloses a removing mechanism of storage device, which comprises a top plate, a bottom plate, a sliding plate, and a control handle. The top plate includes a sliding recess on a first side and a fixing side plate on a second side and a third side, respectively. The fixing side plate includes a plurality of fixing members for fixing the storage device on the top plate. Furthermore, the top plate includes a plurality of extending members below for hanging the bottom plate and enabling the bottom plate to slide below the top plate. The bottom plate includes a plurality of first openings and a second opening between the plurality of first openings. The plurality of first openings enable the plurality of extending members to slide and hang the bottom plate. The sliding plate is disposed slidably between the top plate and the bottom plate. The sliding plate includes a first block member on a first side. The first block member is disposed slidably in the sliding recess. The sliding plate includes a pivot member on a second side. The pivot member is disposed slidably in the second opening and includes a third opening for pivoting the control handle. In addition, the first side of the control handle is connected pivotally between the top plate and the bottom plate. A fourth side of the control handle extends to the top plate and outside a fourth side of the bottom plate, so that the control handle can control the sliding of the sliding plate. Thereby, the first block member is driven to slide in the sliding recess for dismounting the storage device on the top plate rapidly.

According to an embodiment of the present application, the sliding plate includes a projective member on a third side. The bottom plate further includes a fourth opening on a third side. The projective member is disposed slidably in the fourth opening. The fourth opening is smaller than the second opening.

According to an embodiment of the present application, the control handle further includes a second block member on a fourth side and located on the top plate and the fourth side of the bottom plate.

According to an embodiment of the present application, the control handle is connected pivotally between the bottom plater and the top plate for controlling the sliding plate to slide between the bottom plate and the top plate and hence driving the pivot member to slide in the second opening and driving the first block member to slide in the sliding recess.

According to an embodiment of the present application, the sliding block further drives the bottom plate to slide according to the plurality of extending members.

According to an embodiment of the present application, the bottom plate further includes a first recess part on the fourth side; the top plate includes a second recess part on the fourth side; and the first recess part and the second recess part correspond to a handheld part of the control handle.

According to an embodiment of the present application, the plurality of fixing members are elastic fixing members. The bottom plate includes a plurality of recess parts corresponding to the plurality of fixing members. The plurality of fixing members are extended to form a plurality of contact parts for connecting to the plurality of recess parts.

According to an embodiment of the present application, the control handle drives the bottom plate via the sliding plate to move outward and enabling the plurality of contact parts to leave the plurality of recess parts.

According to another embodiment of the present application, the control handle pivots to a second side thereof and thus driving the pivot member to slide on the second opening toward the fourth side. A pivot part of the control handle slides in the third opening toward the third side.

DETAILED DESCRIPTION

Figure 1A:
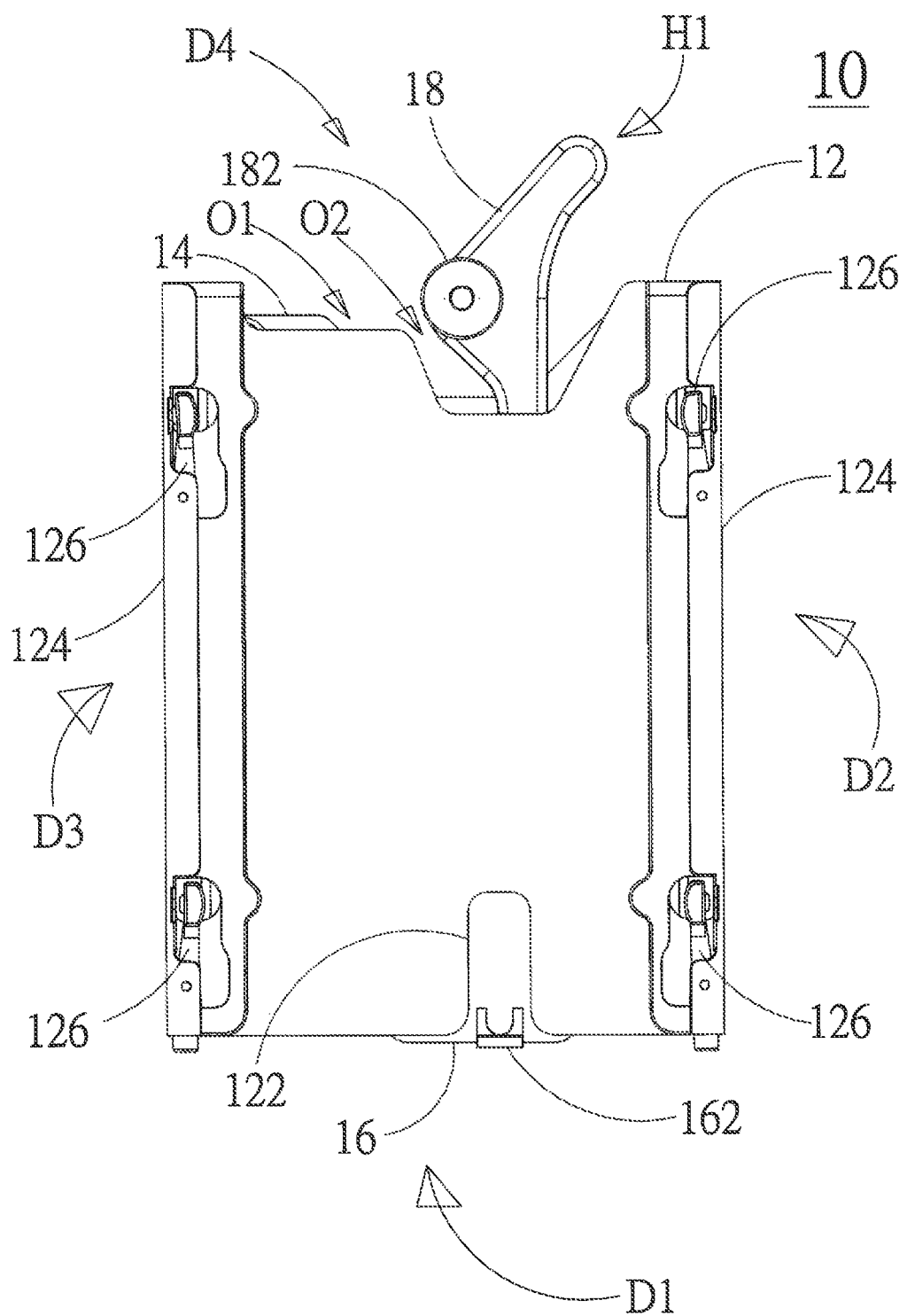
FIG. 1A shows a top view according to an embodiment of the present application.
Figure 1B:
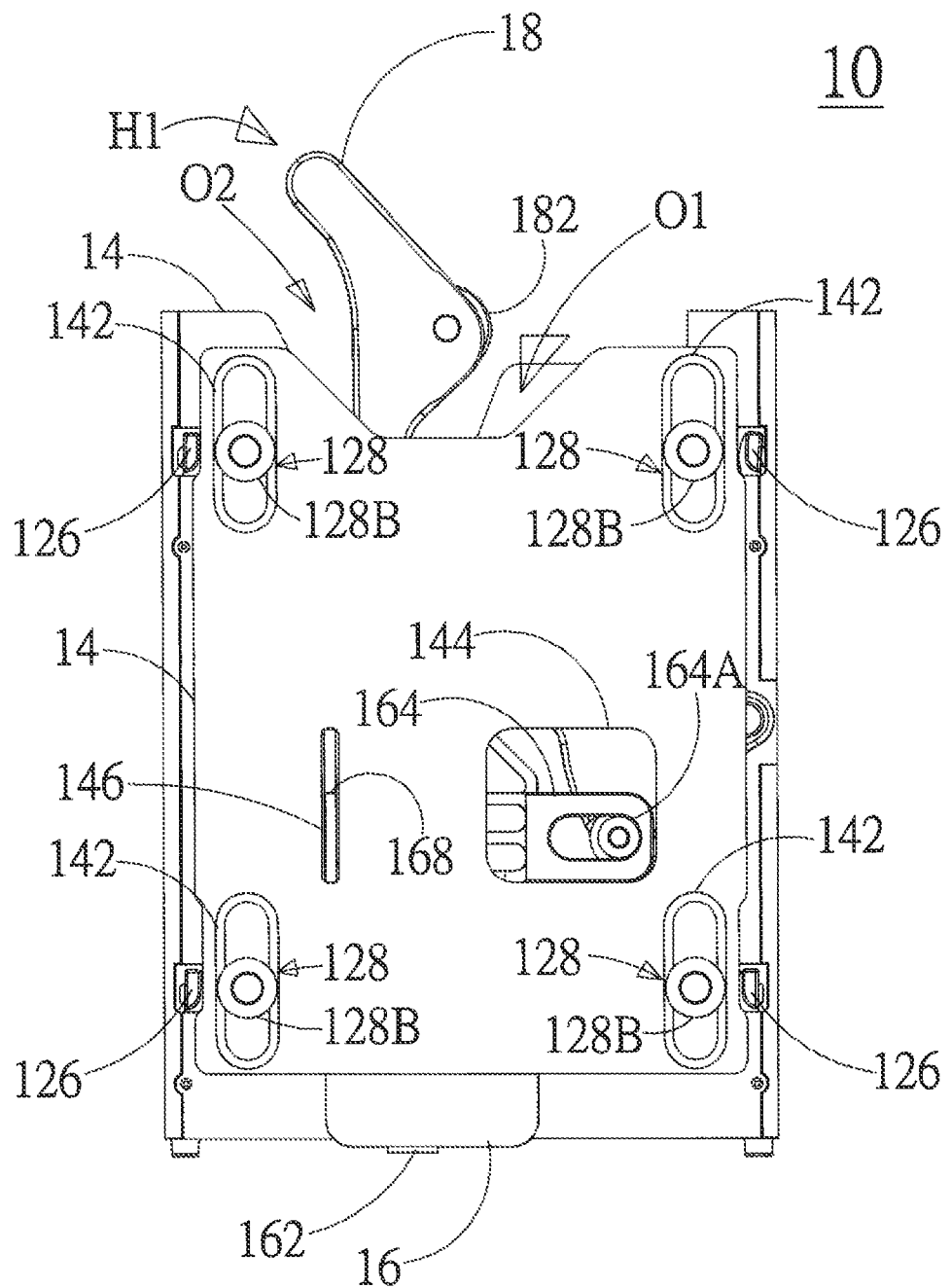
FIG. 1B shows a bottom view according to an embodiment of the present application.
Figure 2A:
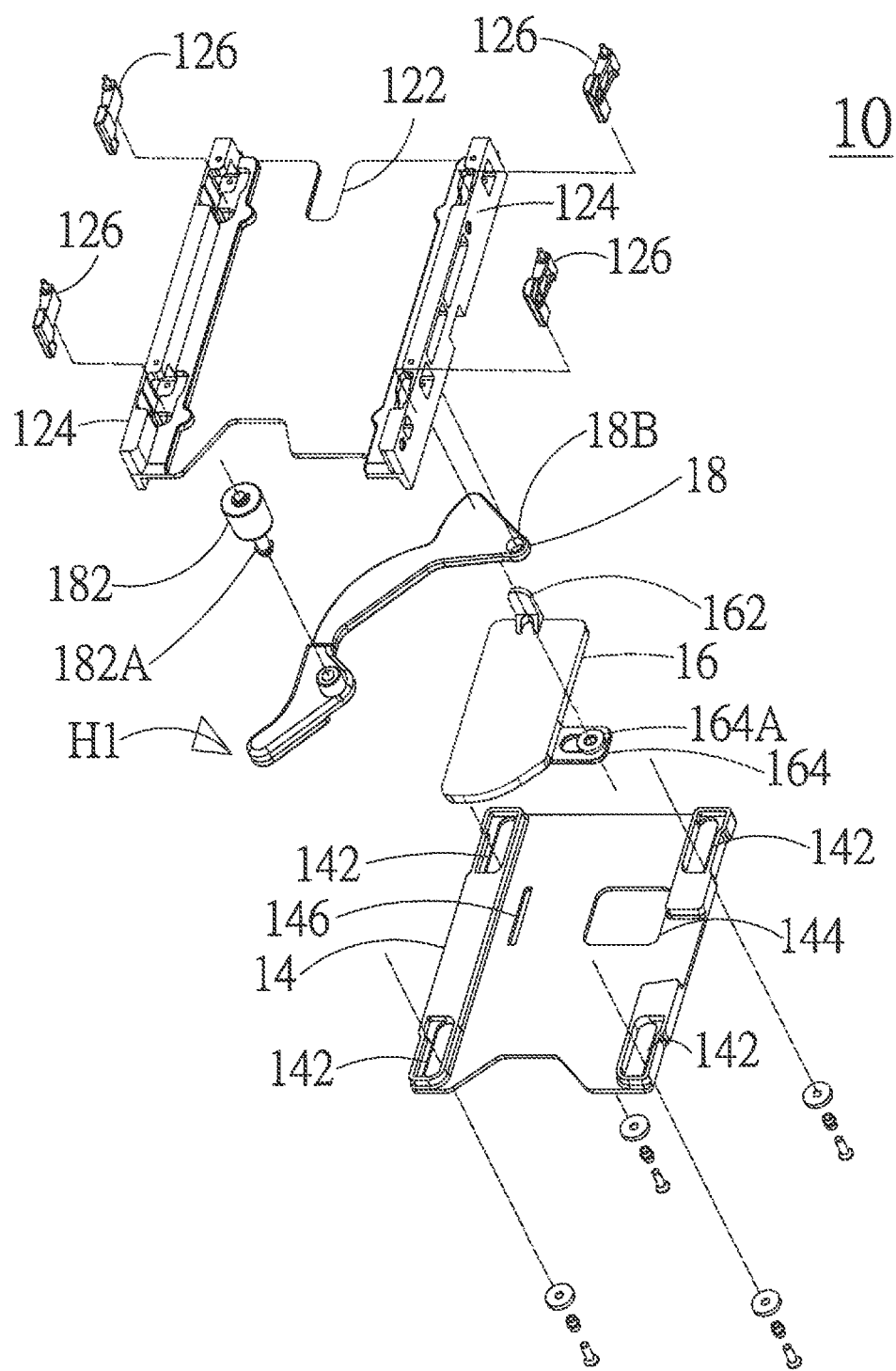
FIG. 2A shows an exploded view according to an embodiment of the present application.
Figure 2B:
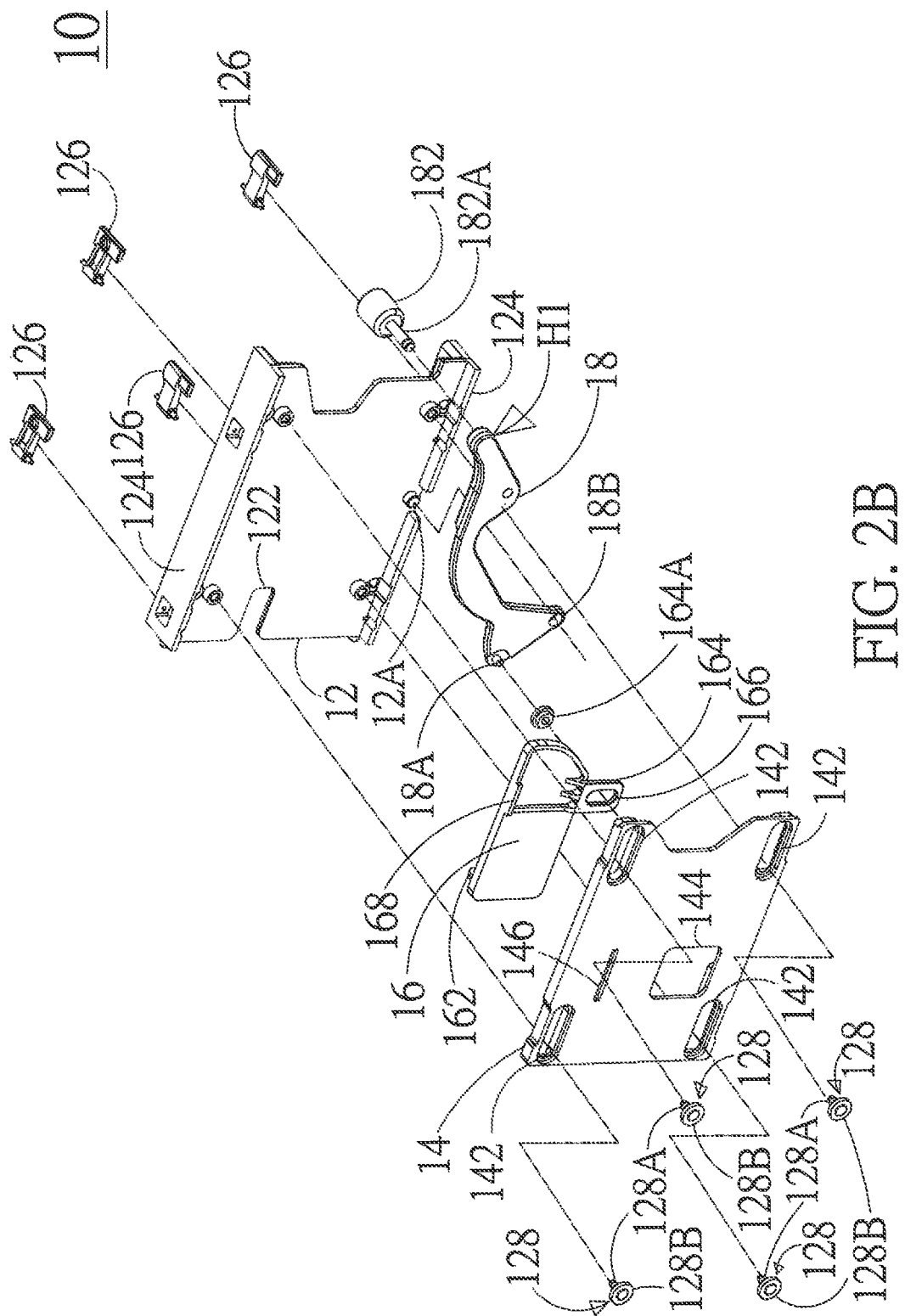
FIG. 2B shows another exploded view according to an embodiment of the present application.

In order to make the structure and characteristics as well as the effectiveness of the present application to be further understood and recognized, the detailed description of the present application is provided as follows along with embodiments and accompanying figures.

Considering that it is difficult to dismount storage devices using the removing mechanism according to the prior art, the present application provides a removing mechanism of storage device for solving the space and volume problems according to the prior art.

In the following, the properties and the corresponding structure of the removing mechanism of storage device disclosed in the present application will be further described.

Firstly, please refer to FIG. 1A to FIG. 2B, in which the figures show a top view, a bottom view, an exploded view, and another an exploded view according to an embodiment of the present application. As shown in the figures, the removing mechanism 10 of storage device according to the present application comprises a top plate 12, a bottom plate 14, a sliding plate 16, and a control handle 18. The top plate 12 includes a sliding recess 122 on a first side D1 and a fixing side plate 124 on a second side D2 and a third side D3, respectively. The fixing side plate 124 includes a plurality of fixing members 126. The top plate 12 includes a plurality of extending members 128 below. The bottom plate 14 is located below the top plate 12 and includes a plurality of first openings 142 and a second opening 144. The sliding plate 16 includes a first block member 162 (such as a block plate) on a first side D1. The sliding plate 16 includes a pivot member 164 on the second side D2. The pivot member 164 includes a third opening 166.

The plurality of extending members 128 are disposed slidably in the plurality of first openings 142. The second opening 144 is located between the plurality of first openings 142. In other words, the plurality of first openings 142 according to the present embodiment are located on the four corners of the bottom plate 14. In addition, they further can be located on the periphery of the bottom plate 14 corresponding to the plurality of extending members 128, so that the plurality of extending members 128 can be disposed slidably in the plurality of first openings 142 and thus enabling the bottom plate 14 to slide below the top plate 12. The extending member 128 according to the present embodiment includes a supporting pillar 128A and a fixing block 128B. By enabling the first block member 162 to slide in the sliding recess 122 and the pivot member 164 to slide in the second opening 144, the sliding plate 16 can slide between the plate 12 and the bottom plate 14. Then the control handle 18 can control the sliding of the sliding plate 16 by pivoting between the top plate 12 and the bottom plate 14 and disposed slidably in the third opening 166 of the pivot member 164 of the sliding plate 16. Accordingly, the pivoting of the control handle 18 controls the sliding of the sliding plate 16, and hence further controlling the first block member 162 to slide in the sliding recess 122.

Figure 3A:
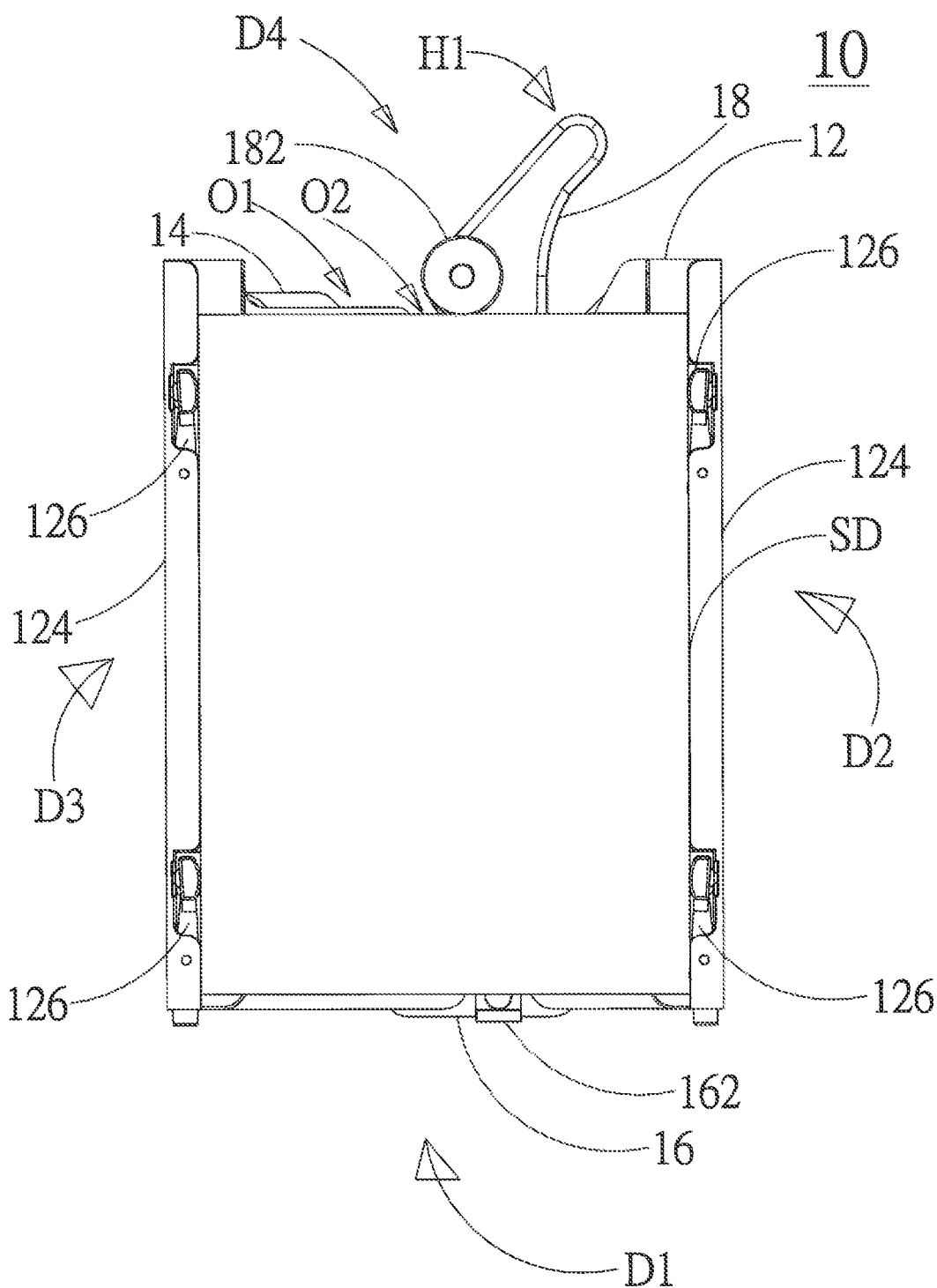
FIG. 3A shows a schematic diagram of mounting the storage device according to an embodiment of the present application.
Figure 3B:
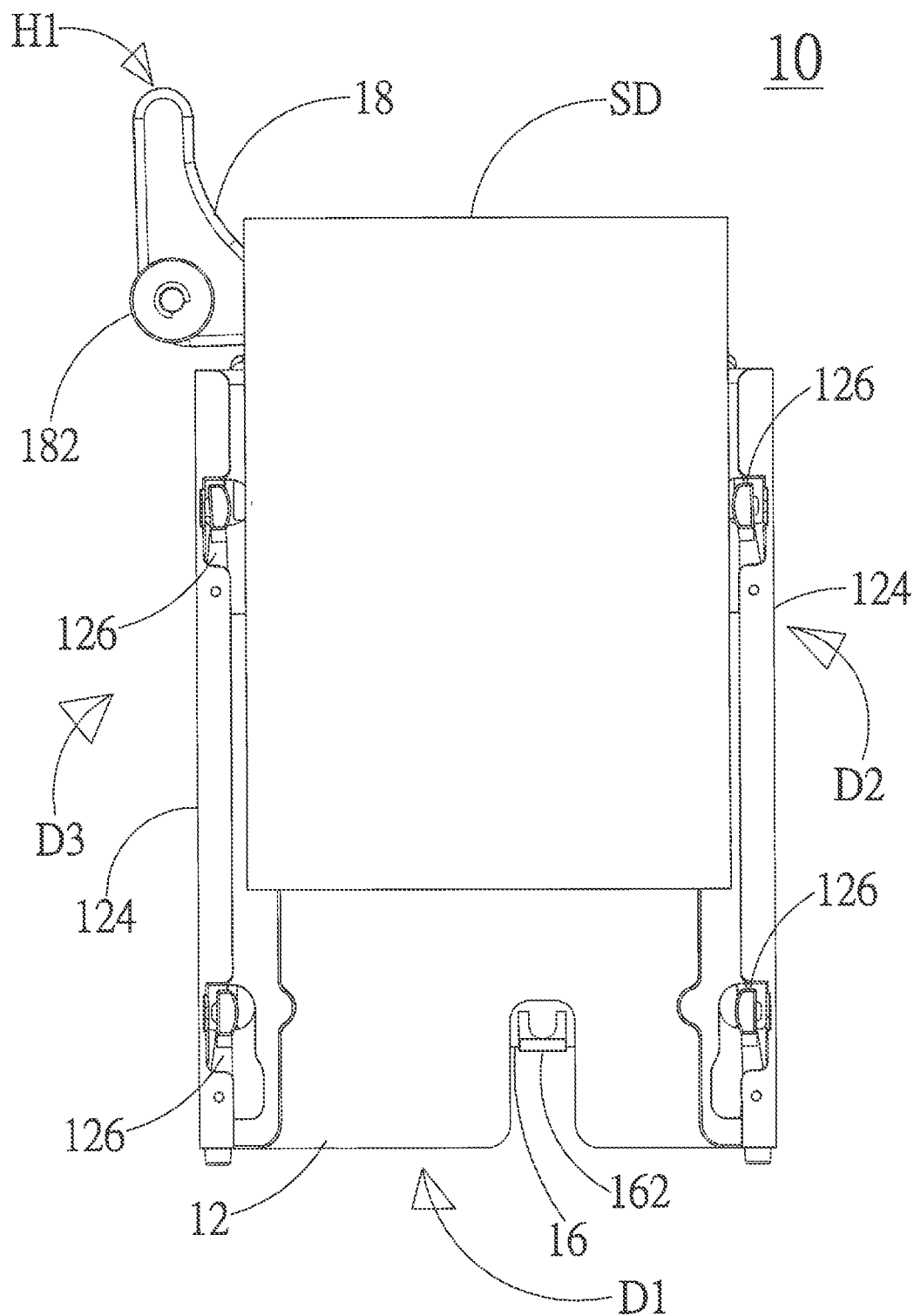
FIG. 3B shows a schematic diagram of dismounting the storage device according to an embodiment of the present application.
Figure 3C:
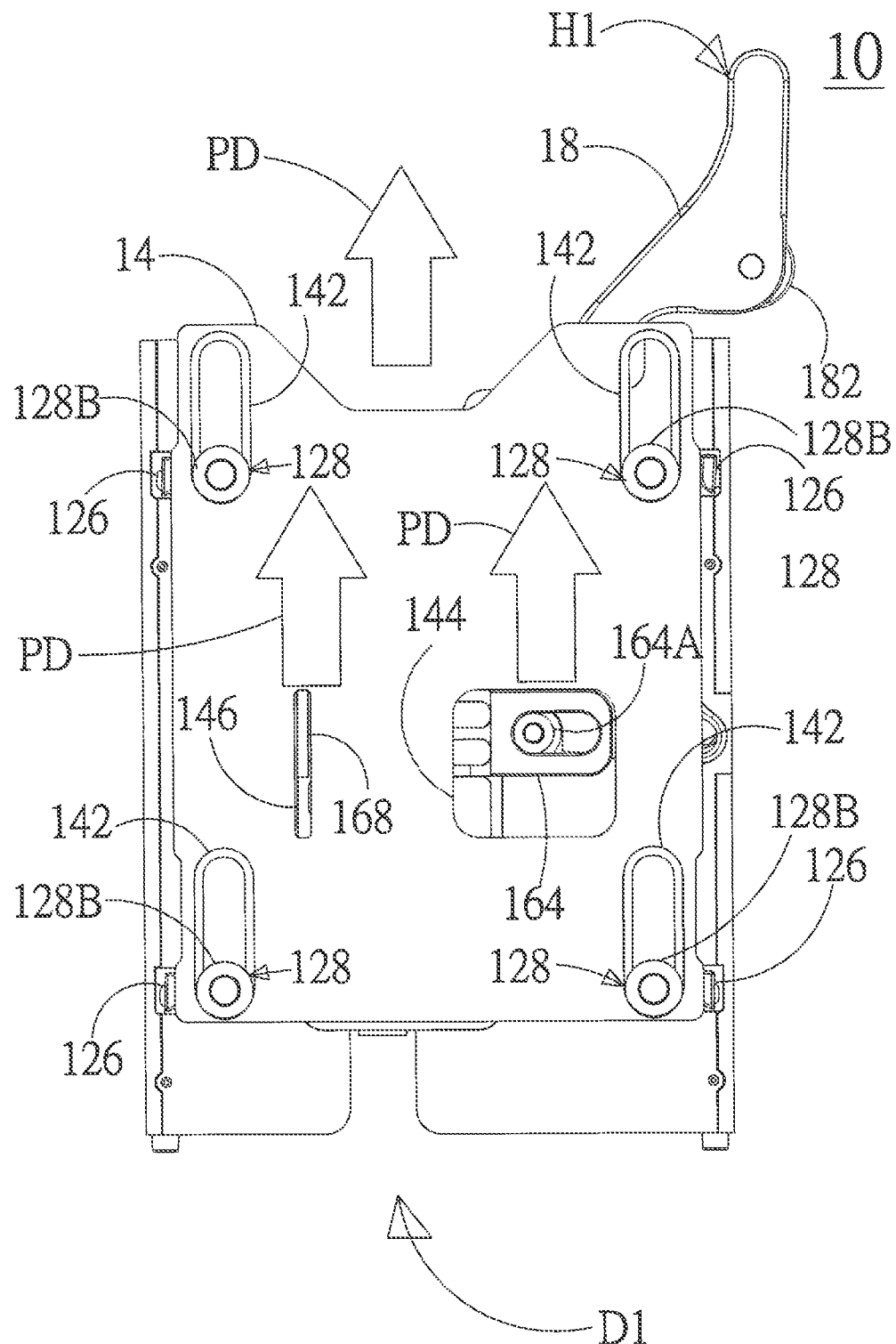
FIG. 3C shows a bottom view of dismounting the storage device according to an embodiment of the present application.

Please refer to FIG. 3A, as well as FIG. 1A to FIG. 2B. A storage device SD is carried on the top plate 12. Thereby, after the first block member 16 slides backwards, the storage device SD will be blocked at the connection location. Furthermore, the control handle 18 includes a second block member 182 on a fourth side D4. Thereby, the second block member 182 can block the storage device SD on the fourth side D4. As shown in FIG. 3B and FIG. 3C, the control handle 18 is pivoted to the second side D2, and hence enabling the first block member 162 to push forward along the sliding recess 122 for dismounting the storage device SD. Since the control handle 18 is linked to the sliding plate 16, the bottom plate 14 will be driven to slide accordingly. Thereby, the removing mechanism 10 can be pushed by the block member 162 as the block member 162 slides along the sliding recess 122 and be dismounted easily.

Please refer again to FIG. 2A and FIG. 2B. The sliding plate 16 includes a projective member 168. The bottom plate 14 further includes a fourth opening 146 on the third side D3. The projective member 168 slides in the fourth opening 146. The fourth opening 146 is smaller than the second opening 144. By enabling the control handle 18 to slide in the third opening 166 of the pivot member 164 and the projective member 168 to slide in the fourth opening 146, the control handle 18 can control the sliding plate 16 to slide between the bottom plate 14 and the top plate 12, and then driving the pivot member 164 to slide in the second opening 144 and the first block member 162 to slide in the sliding recess 122. Moreover, the pivot member 164 drives the bottom plate 14 to slide according to the plurality of extending members 128. According to the present embodiment, the pivot member 164 further includes a pivot block 164A connected with a pivot pillar 18A on the control handle 18. The top plate 12 includes a pivot pillar 12A inserting into a pivot hole 18B in the control handle 18. The above pivot connection is only an example, not used to limit the connection method.

Figure 4A:
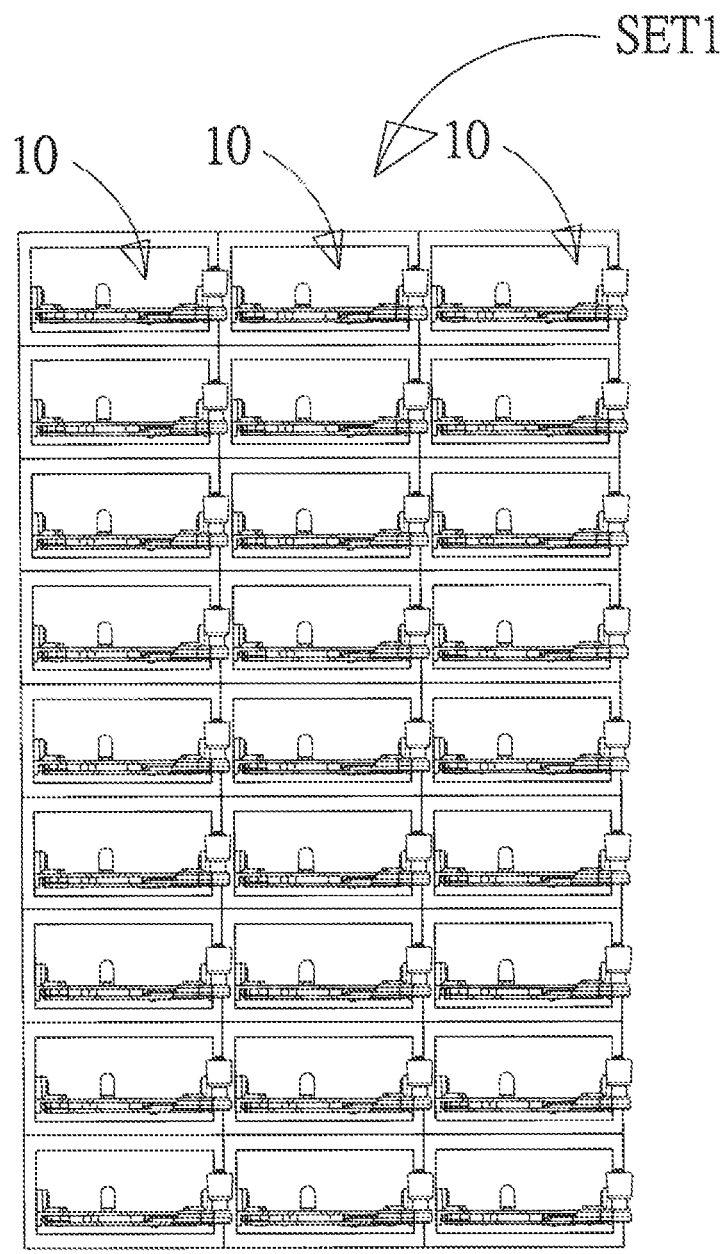
FIG. 4A shows a schematic diagram of the rack according to another embodiment of the present application.
Figure 4B:
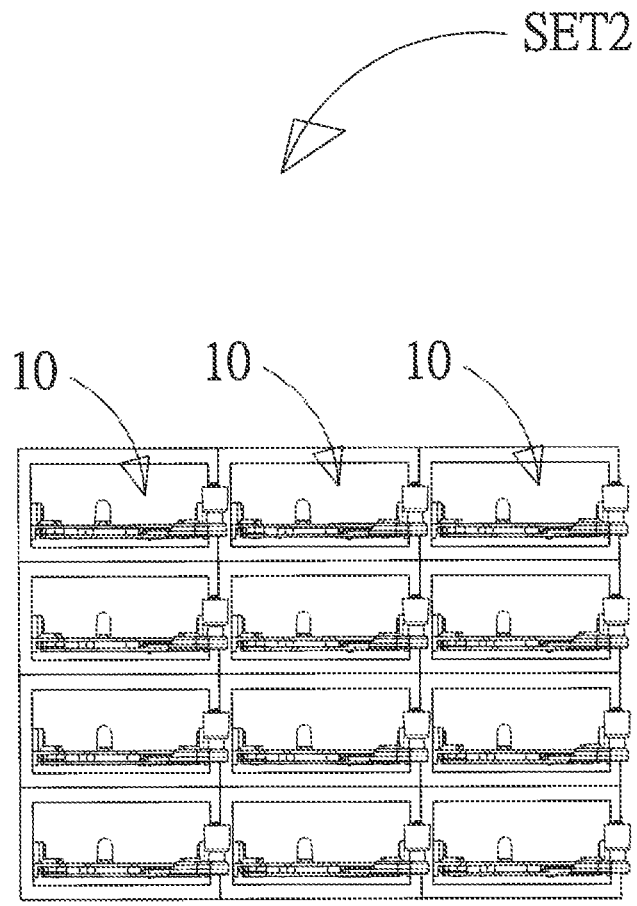
FIG. 4B shows a schematic diagram of the rack according to another embodiment of the present application.

In addition, the bottom plate 14 further includes a first recess part O1 on the fourth side D4. The top plate 12 includes a second recess part O2 on the fourth side D4. The first recess part O1 and the second recess part O2 correspond to a handheld part H1 of the control handle 18. Since the plurality of fixing members 126 as described above are elastic fixing members for fixing elastically the storage device SD disposed on the top plate 12. Besides, the elasticity of the elastic fixing members can reduce the shock and vibration caused by the hard disks operating at high speed. As shown in FIGS. 4A and 4B, according to the requirement of the field, the removing mechanism 10 according to the present application can be mounted to a vertical cabinet SET1 or another vertical cabinet SET2.

To sum up, the present application provides a removing mechanism of storage device. The control handle controls the sliding plate to slide between the top plate and the bottom plate, and hence extending the sliding plate to the first block member on the top plate for dismounting the storage device on the top plate. Thereby, the operating space and the volume of the removing mechanism can be minimized.

Accordingly, the present application conforms to the legal requirements owing to its novelty, non-obviousness, and utility. However, the foregoing description is only embodiments of the present application, not used to limit the scope and range of the present application. Those equivalent changes or modifications made according to the shape, structure, feature, or spirit described in the claims of the present application are included in the appended claims of the present application.

What is claimed is:

1. A removing mechanism of storage device, mounting to a cabinet for removing a storage device, comprising:
    a top plate, including a sliding recess on a first side, including a fixing side plate on a second side and a third side, respectively, said fixing side plate including a plurality of fixing members on the inner side, and said top plate including a plurality of extending members below;
    a bottom plate, located below said top plate, including a plurality of first openings and a second opening, said second opening located between said plurality of first openings, and said plurality of extending members sliding in said plurality of first openings and hanging said bottom plate;
    a sliding plate, sliding between said top plate and said bottom plate, including a first block member on a first side, said first block member sliding in said sliding recess, said sliding plate including a pivot member on a second side, said pivot member sliding in said second opening, and said pivot member including a third opening; and
    a control handle, pivoting between said top plate and said bottom plate with a first side, sliding in said third opening for moving said sliding plate with linkage, and a fourth side of said control handle extending outside a fourth side of said top plate and said bottom plate.

2. The removing mechanism of storage device of claim 1, wherein said sliding plate includes a projective member on a third side; the bottom plate includes a fourth opening on a third side; said projective member slides in said fourth opening; and said fourth opening is smaller than said second opening.

3. The removing mechanism of storage device of claim 1, wherein said control handle further includes a second block member on a fourth side and is located on said top plate and said fourth side of said bottom plate.

4. The removing mechanism of storage device of claim 1, wherein said control handle pivots between said bottom plate and said top plate for controlling said sliding plate to slide between said bottom plate and said top plate, driving said pivot member to slide in said second opening, and driving said first block member to slide in said sliding recess.

5. The removing mechanism of storage device of claim 4, wherein said pivot member further drives said bottom plate to slide according to said plurality of extending members.

6. The removing mechanism of storage device of claim 1, wherein said bottom plate further includes a first recess part on said fourth side; said top plate includes a second recess part on said fourth side; and said first recess part and said second recess part correspond to a handheld part of said control handle.

7. The removing mechanism of storage device of claim 1, wherein said plurality of fixing members are elastic fixing members; said bottom plate includes a plurality of recess parts corresponding to said fixing members.

8. The removing mechanism of storage device of claim 7, wherein said control handle is driven by said sliding plate and moves outward for enabling said plurality of contact parts to leave said plurality of recess parts.

9. The removing mechanism of storage device of claim 1, wherein said control handle pivots to a second side for driving said pivot member to slide in said second opening and toward said fourth side; and a pivot part of said control handle slides in said third opening and toward said third side.

* * * * *